(12) United States Patent
Tseng

(10) Patent No.: US 6,271,128 B1
(45) Date of Patent: Aug. 7, 2001

(54) METHOD FOR FABRICATING TRANSISTOR

(75) Inventor: Horng-Huei Tseng, Hsinchu (TW)

(73) Assignee: Vanguard International Semiconductor Corp., Hsinchu (TW)

(*) Notice: Subject to any disclaimer, the term of this patent is extended or adjusted under 35 U.S.C. 154(b) by 0 days.

(21) Appl. No.: 09/734,287

(22) Filed: Dec. 11, 2000

Related U.S. Application Data

(63) Continuation-in-part of application No. 09/675,972, filed on Sep. 29, 2000.

(51) Int. Cl.$^7$ .................................................. H01L 21/4763
(52) U.S. Cl. ........................ 438/638; 438/637; 438/666; 438/668
(58) Field of Search .................................. 438/624, 637, 438/638, 641, 672, 666, 668, 675, 629

(56) References Cited

U.S. PATENT DOCUMENTS

| | | | |
|---|---|---|---|
| 4,341,850 * | 7/1982 | Coane | 430/11 |
| 6,074,942 * | 6/2000 | Lou | 438/632 |
| 6,083,822 * | 7/2000 | Lee | 438/624 |
| 6,096,590 | 8/2000 | Chan et al. | 438/233 |
| 6,103,456 * | 8/2000 | Tobben et al. | 430/317 |
| 6,187,663 * | 2/2001 | Yu et al. | 438/638 |
| 6,197,681 * | 3/2001 | Liu et al. | 438/637 |

* cited by examiner

Primary Examiner—Kevin M. Picardat
(74) Attorney, Agent, or Firm—Jiawei Huang; J. C. Patents

(57) ABSTRACT

A method for fabricating a transistor having a T-shape gate. A substrate having a sacrificial layer, a metal layer and an insulating layer in turn formed thereon is provided. A masking layer is formed over the insulating layer, and then using the patterned masking layer as a mask a portion of the insulating layer and the metal layer are removed to formed the first gate window. The masking layer is then further laterally removed, and using the remained masking as a mask the remained insulating layer is further laterally removed to form a second gate window. Therefore, a T-shape gate window is formed and a T-shape gate structure can be formed within the T-shape gate window.

25 Claims, 4 Drawing Sheets

METHOD FOR FABRICATING TRANSISTOR

CROSS-REFERENCE TO RELATED APPLICATION

The present application is a continuation in part of Applicant's application Ser. No. 09/675,972 filed Sep. 29, 2000, entitled 'METHOD FOR FABRICATING TRANSISTOR', currently pending, which is not admitted to be prior art with respect the present invention by its mention in the background.

BACKGROUND OF THE INVENTION

1. Field of the Invention

This invention relates in general to a method for forming integrated circuit devices, and more specifically relates to a method for fabricating a transistor having a T-shape gate structure.

2. Description of the Related Art

Generally, a standard process for forming a transistor comprising forming a polysilicon gate, implanting ions to form source/drain regions and forming a gate silicide on the polysilicon gate. As the semiconductor technology trends to a higher integration, the device size significantly reduces. When the device size decreases the gate length thus reduces down below 0.2 $\mu$m, and he resistance of the gate increases because the gate silicide has the same length as the underlying polysilicon gate. The increased resistance results in slowing down the speed and performance of the device due to RC delay.

Conventionally, one of the solutions to solve the increased resistance problem, such as disclosed by U.S. Pat. No. 6,096,590 issued to Chan et al., a metal gate longer than the polysilicon gate is formed over the polysilicon; namely a T-shape gate is formed to reduce the resistance of the gate. However, this procedure requires performing many steps of photolithography and highly alignment for forming the polysilicon gate first. Therefore, the process becomes complex and hard to control the produce yield rate, and furthermore manufacturing cost thus increases.

SUMMARY OF THE INVENTION

According to the foregoing description, this invention is to provide a method for fabricating a transistor. First, a substrate is provided, which a sacrificial layer, a metal layer and an insulating layer in turn formed thereon. A patterned masking layer is formed over the insulating layer used for defining a first gate window. A portion of the insulating layer and the metal layer are removed by etching for example using the patterned masking layer as a mask to formed the first gate window, and a portion of the sacrificial layer is exposed to the first gate window. The masking layer is laterally removed, and using the remained masking layer as a mask the remained insulating layer is also laterally removed to form a second gate window. The width of second gate window is greater than the width of the first gate window, and both the first and the second gate windows form a T-shape gate window. The masking layer can be a positive photoresist layer and removed using an oxygen-containing plasma.

A thermal process is performed and then source and drain regions are formed by alloying the metal layer and the sacrificial layer under the metal layer. After the sacrificial layer within the T-shape gate window is removed, a gate dielectric layer is formed over the remained insulating layer and the source and drain regions. A gate electrode can therefore be formed within the T-shape gate window. If the gate electrode is made of metal tungsten, the tungsten can be formed using a tungsten hexacarbonyl as a reaction gas.

Another embodiment of this invention, it is to provide a method for fabricating a T-shape opening. First, substrate having a material layer thereon is provided. A patterned masking layer is then formed over the material layer for defining a first opening. A portion of material layer is removed using the patterned masking layer as a mask to formed the first gate window. The masking layer is further laterally removed by etching for example. Using the remained masking layer as a mask, the remained material layer is also removed by such as etching to form a second opening. As a result, the width of second opening is greater than the width of the first opening, and the first and the second gate opening form a T-shape opening. The masking layer can be a positive photoresist layer and removed using an oxygen-containing plasma.

Advantageously, only one masking layer is required to form a T-shape gate window and then form a T-shape gate electrode within the T-shape gate window, or to form a T-shape opening, via or hole in a material layer. No additional masking layer and photolithography step is required and therefore the manufacturing process is simplified and manufacturing cost reduces.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings in which:

DESCRIPTION OF THE PREFERRED EMBODIMENT

FIGS. 1 to 10 show cross-sectional views of the method for manufacturing a transistor having a T-shape gate structure according to the present invention. Detailed description for the method is disclosed as followings accompany with the drawings.

Figure 1:
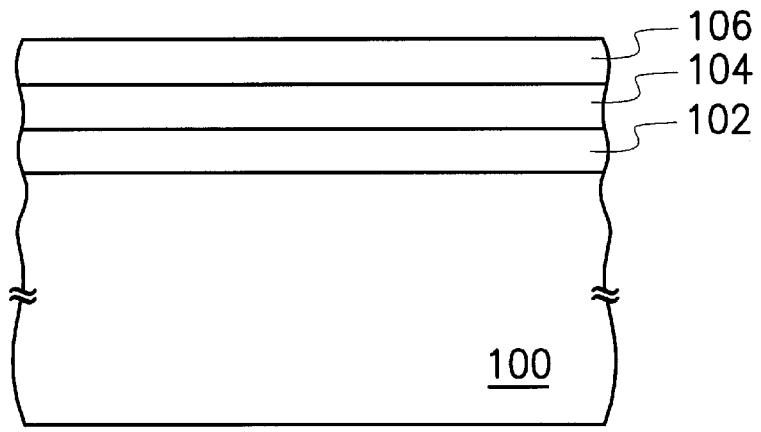
FIGS. 1 to 10 show cross-sectional views of the method for manufacturing a transistor having a T-shape gate structure according to the present invention.

Referring to FIG. 1, a sacrificial layer 102, a metal layer 104 and an insulating layer are formed in tern over a substrate 100. The substrate 100 may be made of silicon, germanium or other suitable material known to those skilled in this art. The sacrificial layer 102 can be $Si_{1-x}Ge_x$, GaAs, InGaAs, InP, $In_{1-x}Ga_xAs_yP_{1-y}$, or any other suitable material. The metal layer 104 can be any conductive material, such as Co, Ni, Pd, Pt, Rh, Ta, Ti, W or their combination. After the metal layer 104 is formed over the sacrificial layer 102, the insulating layer 106, such as an oxide layer, is formed over the metal layer 104.

Figure 2:
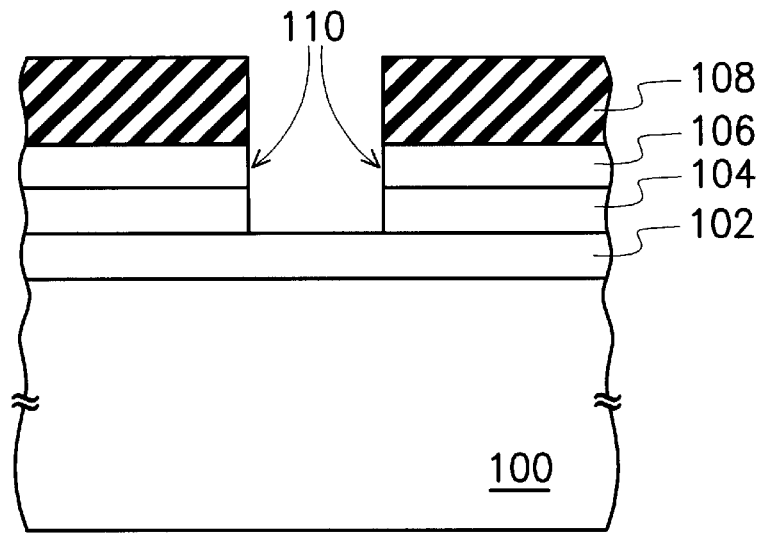

Referring to FIG. 2, a masking layer 108, for example a positive photoresist layer, is formed over the insulating layer 106 to define a first gate window 110. The masking layer 108 comprises a pattern suitable for forming the first gate window 110. An etching process, for example, is then used for forming the first gate window 110 through the insulating layer 106 and the metal layer 104, and to expose the sacrificial layer 102.

Figure 3:
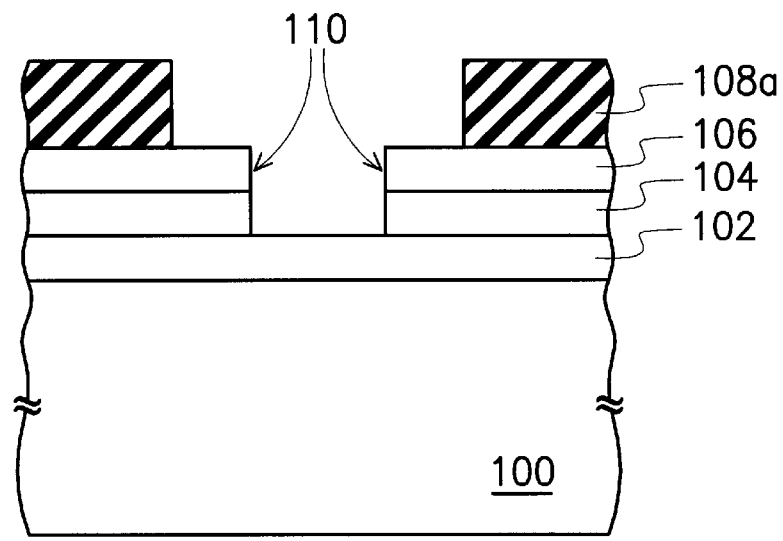
Figure 4:
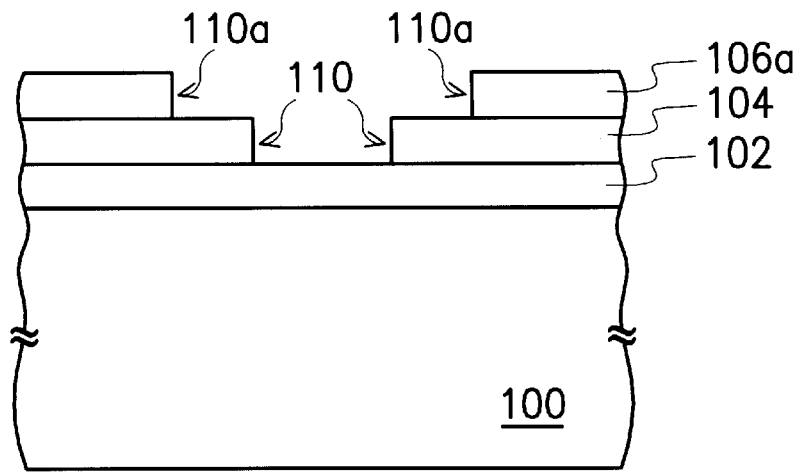

After the first gate window 110 is formed, the masking layer 108 is laterally removed by such as an isotropic etching process etching to expose a portion top surface of the insulating layer 106, as shown in FIG. 3. The remained masking layer is labeled 108a. Then, using the masking layer 108a as a mask, a portion of the insulating layer 106 is then laterally removed by such as an anisotropic etching process etching to expose a portion top surface of the metal layer 104, as shown in FIG. 4, to form a second gate window 110a. The anisotropic etching process is a dry-etching process, such as using oxygen-containing plasma, to expose portions of the insulating layer 106. The remained insulating layer is labeled 106a. As shown in FIG. 4, the width of the second gate window 110a is greater than the width of the first gate window 110. The first gate window 110 and the second gate windows 110a constructs a T-shape gate window. Namely, the width of the second gate window 110a is greater than that of the first gate window 110. The masking layer 108a is then removed. The method for removing the masking layer 108a uses, for example, an oxygen-containing plasma, if the masking layer 108a is a positive photoresist layer.

Figure 5:
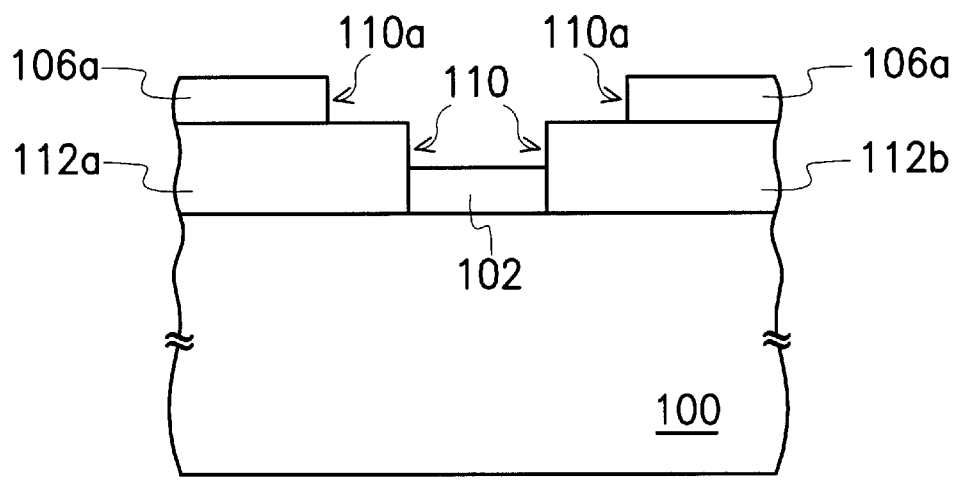

Referring to FIGS. 4 and 5, a thermal process such as alloy, is performed for forming source and drain regions of the transistor. The metal layer 104 and the underlying sacrificial layer 102 are then alloyed to form a source and drain regions 112a, 112b, while the sacrificial layer 102 exposed by the first gate window 110 is not alloyed with the metal layer 104. After the source and drain regions 112a, 112b are formed, the sacrificial layer 102 in the gate window 110 is removed by any possible etching process.

Figure 6:
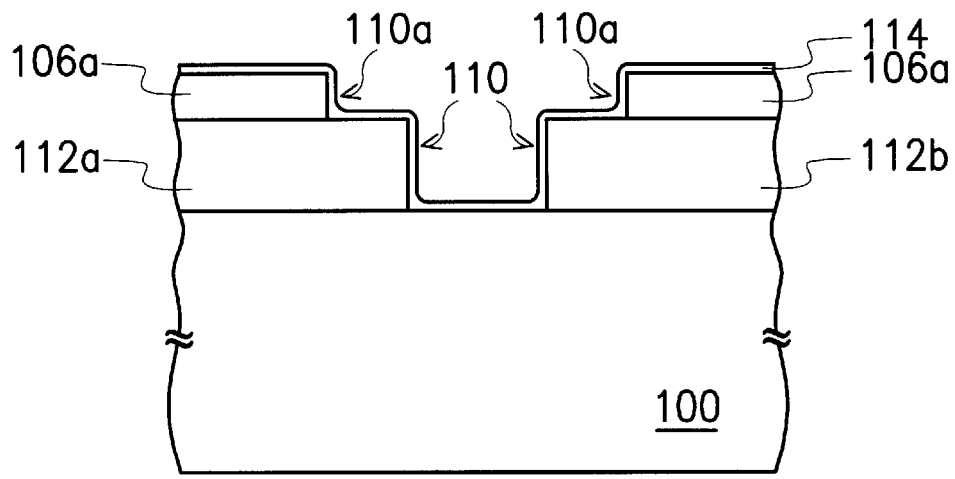

Next, referring to FIG. 6, a gate dielectric layer 114 is formed to cover the exposed surface of the insulating layer 106a, the source and drain regions 112a, 112b and the substrate 100. The gate dielectric layer 114 can be made of silicon oxide, silicon nitride, silicon oxynitride, oxynitride, a silicon oxide/silicon nitride composite, metal oxide (such as $TiO_x$, $Ta_xO_y$), or any combination thereof. The gate dielectric layer 114 has a typically range from 2 to 20 nm, or even less. The gate dielectric layer 114 can be formed by deposition or by growing a dielectric layer.

Figure 7:
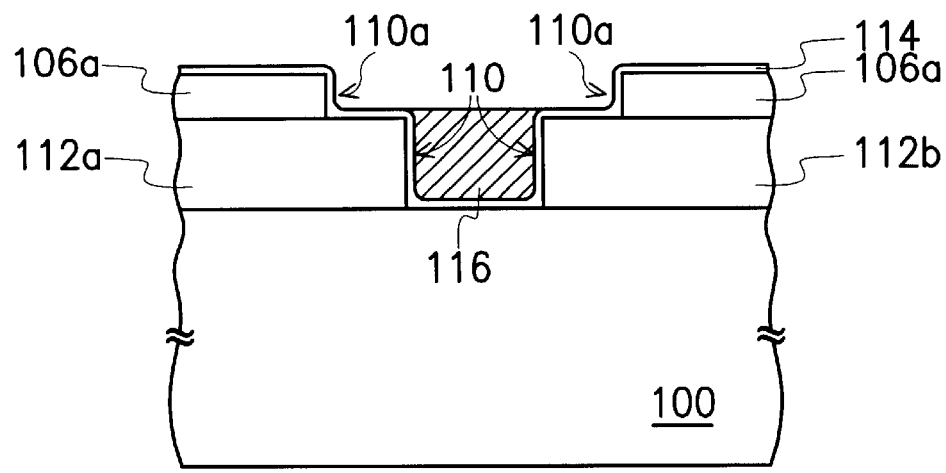
Figure 8:
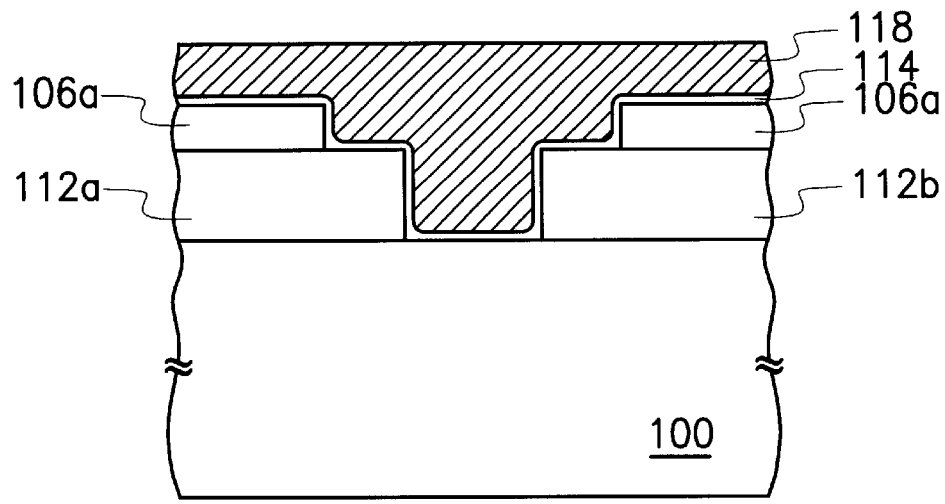

Referring to FIGS. 7 and 8, a conductive material 116 is formed within the lower portion of the T-shape gate window, such as the first gate window 110. The conductive material serves as a plug. Then, a metal or conductive layer 118 is formed over the substrate 110 to cover the gated dielectric layer 114 and then is filled up within the T-shape gate window. The conductive material 116 can be a doped polysilicon layer and formed by deposition or other suitable method. It should be noticed that the foregoing mentioned step to form a plug within the lower portion of the T-shape gate window is optional.

It should be noticed that to form the polysilicon plug first is not necessary. As shown in FIG. 8, after the gate dielectric layer 114 is formed, a metal or conductive layer 118 can be formed over the gate dielectric layer 114 and filled up within the T-shape gate window without forming the polysilicon plug first. In addition, the metal or conductive layer 118 can be made of Al, W or doped polysilicon.

If the metal or conductive layer 118 is made of tungsten, it is difficult to form a tungsten metal layer directly on the gate dielectric layer using conventional $WF_6$ reaction gas. In general, the thickness of the gate dielectric layer 114 is about 20 angstrom or less as mentioned above. According to the conventional method, the metal W is deposited using the reaction gas WF6, resulting in that the transistor performance is degraded. During the tungsten deposition, the gas WF6 is decomposed and fluorine F is produced. The fluorine F then reacts with the gate dielectric (or gate oxide) layer and damages the gate dielectric (or gate oxide) layer. Accordingly, before the tungsten deposition, a doped polysilicon layer has to be first formed on the gate dielectric layer for preventing damage of the gate dielectric layer.

In order not to degrade the transistor performance, a tungsten hexacarbonyl $W_x(CO)_y$, such as $W(CO)_6$, is used as the reaction gas for forming the metal W on the gate dielectric layer 114. Therefore, no fluorine component is existed in the reaction gas, and therefore the gate dielectric layer is not damaged during forming the tungsten gate. Accordingly, it is not necessary to form a doped polysilicon layer on the gate dielectric layer first and the manufacturing process can be simplified.

Figure 9:
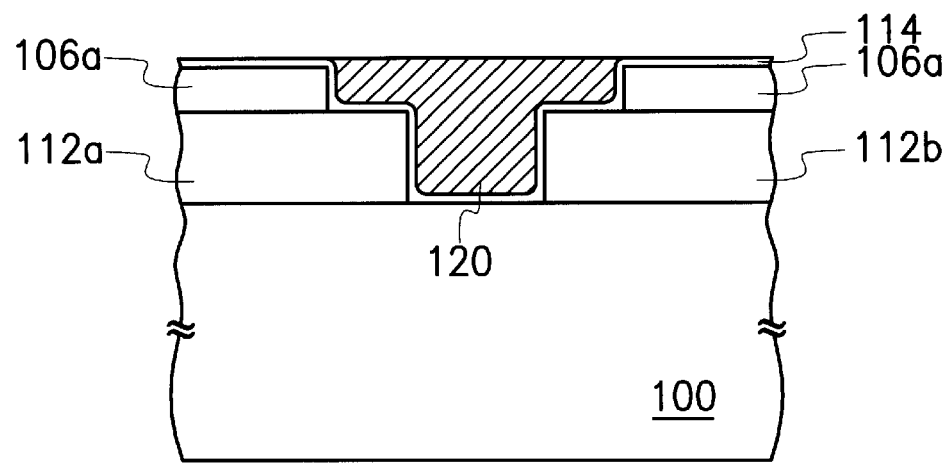

Referring to FIG. 9, a portion of the metal layer 118 above the insulating layer 106a is removed to form a gate electrode 120. The portion of metal layer 118 can be removed or planarized by etching back or chemical mechanical polishing (CMP). The formed gate electrode 120 is coplanar with the upper surface 130 of the gate dielectric layer 114 over the insulating layer 106a, and therefore to form a T-shape gate structure. In the present invention, no additional photolithography step is required. As discussed above, after the first gate window 110 is formed using the photoresist 108, the photoresist 108 is further laterally removed. Using the remained photoresist 108a, the insulating layer 106 is further laterally removed to formed a second gate window 110a, and therefore the T-shape gate window is formed without additional photolithography step to define the upper portion of the T-shape gate window.

As taught by the present invention, the process for forming the T-shape gate structure is simplified. Once the photoresist layer 108 is formed to define the first gate window 110, the same photoresist layer can be further laterally etched and then used as a mask to define the second gate window 110a. Therefore, only one photoresist layer is required to define the T-shape gate window and manufacturing cost reduces.

Figure 10:
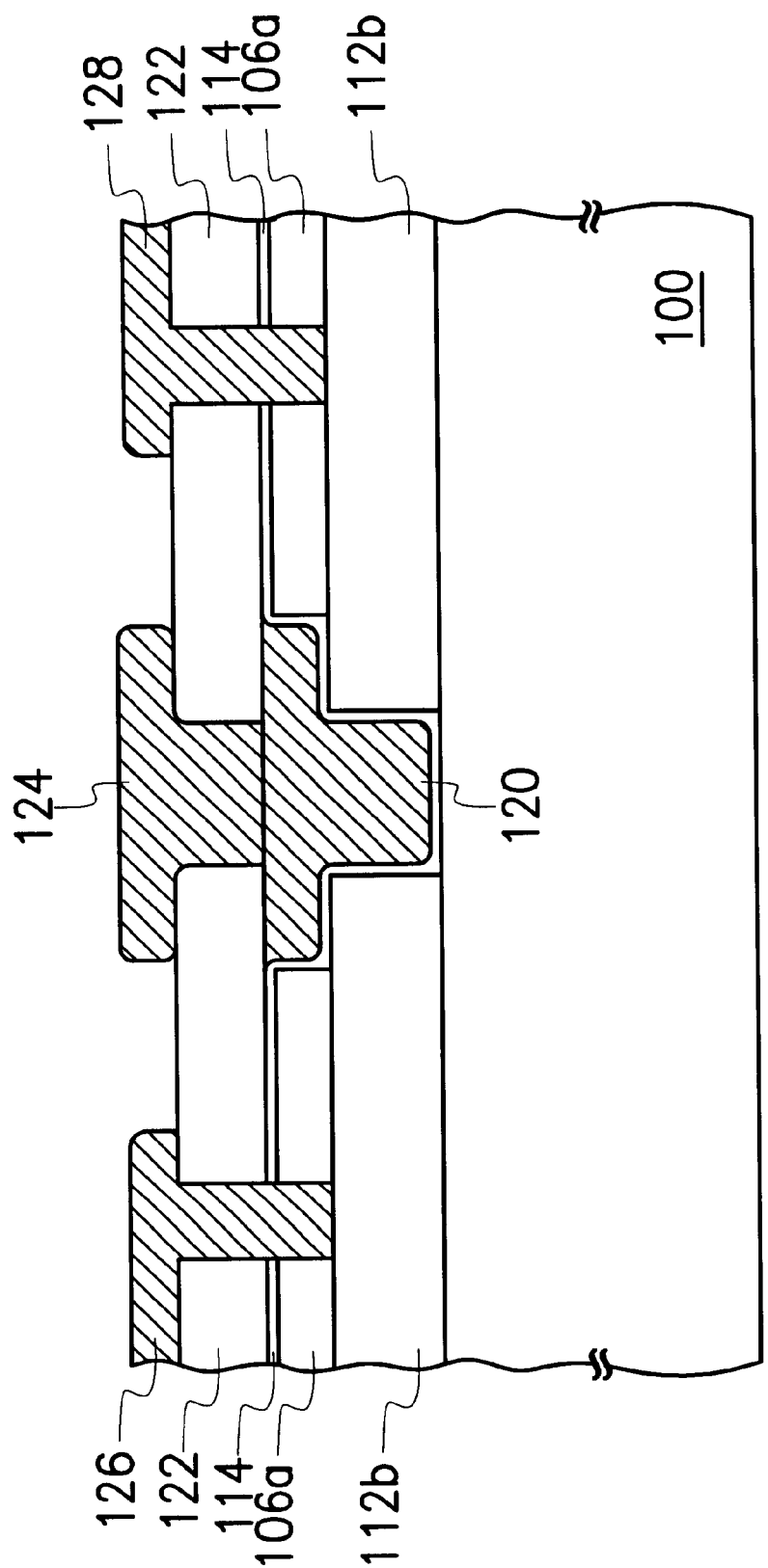

In addition, as shown in FIG. 10, subsequent process for forming interconnects or contacts can be the same as the generally well know method. For example, an insulating layer 122 can be further formed over the gate dielectric layer 114 and the gate electrode 120. The insulating layer 12 is, for example, made of silicon oxide or suitable dielectric layer. Openings or vias can then be formed within the insulating layer 122 to expose the source and drain regions 112a, 112b and the gate electrode 120. As the openings or vias are formed, conductive material, such as tungsten, is filled within the openings or vias to form connection plugs or interconnects 126, 124 and 128.

In the embodiment, a method for fabricating a transistor having a T-shape gate structure is disclosed. However, it should be noticed that the claimed method is not only applied for forming a transistor but also a T-shape opening, via or hole within a material layer. The material can be an insulating layer, such as a dielectric layer, or any layer requiring a T-shape opening formed therein. For example, a photoresist layer is formed over a material layer to define a first opening and then the photoresist layer is laterally removed. Using the remained photoresist layer as a mask, the material is further defined a second opening having a width larger than the width of the first opening, and therefore a T-shape opening is formed within the material layer. The process is substantially the same as forming the T-shape gate window, and the detailed description can be referred to the foregoing discussion.

In summary, only one photoresist layer is required to form a T-shape gate window and then form a T-shape gate electrode within the T-shape gate window, or to form a T-shape opening, via or hole in a material layer. No additional photoresist layer and photolithography step is required and therefore the manufacturing process is simplified and manufacturing cost reduces.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What claimed is:

1. A method for fabricating a transistor, comprising:

providing a substrate having a sacrificial layer, a metal layer and an insulating layer in turn formed thereon;

forming a patterned masking layer over the insulating layer for defining a first gate window;

removing a portion of the insulating layer and the metal layer using the patterned masking layer as a mask to formed the first gate window, and a portion of the sacrificial layer is exposed to the first gate window;

laterally removing a portion of the patterned masking layer;

laterally removing a portion of the remained insulating layer using the remained masking as a mask to form a second gate window, wherein the width of second gate window is greater than the width of the first gate window, and the first and the second gate windows form a T-shape gate window;

completely removing the patterned masking layer;

performing a thermal process to form a source and a drain regions by a reaction between the metal layer and the sacrificial layer under the metal layer;

removing the sacrificial layer within the T-shape gate window;

forming a gate dielectric layer over the remained insulating layer and the source and drain regions; and forming a gate electrode within the T-shape gate window.

2. The method of claim 1, wherein the step for forming the gate electrode further comprises:

forming a conductive layer over the gate dielectric layer and filled up within the T-shape gate window; and removing a portion of the conductive layer to form the gate electrode having a surface coplanar with the surface of the gate dielectric layer above the remained insulating layer.

3. The method of claim 2, wherein the portion of the conductive layer is removed by chemical mechanical polishing (CMP).

4. The method of claim 2, wherein the portion of the conductive layer is removed by etching back.

5. The method of claim 1, wherein the masking layer is a positive photoresist layer.

6. The method of claim 5, wherein the step for laterally removing a portion of the patterned masking layer is performed using an oxygen-containing plasma.

7. The method of claim 2, wherein the conductive layer is made of tungsten.

8. The method of claim 7, wherein the tungsten is deposited using a tungsten hexacarbonyl as a reaction gas.

9. The method of claim 1, wherein the step for forming the gate electrode further comprises:

forming a first conductive layer within a lower portion of the T-shape gate window;

forming a second conductive layer over the gate dielectric layer and filled up within the T-shape gate window; and removing a portion of the second conductive layer to form the gate electrode having a surface coplanar with the surface of the gate dielectric layer above the remained insulating layer.

10. The method of claim 9, wherein the first conductive layer is made of tungsten.

11. The method of claim 10, wherein the tungsten is deposited using a tungsten hexacarbonyl as a reaction gas.

12. The method of claim 1, wherein the thermal process is an alloy process for alloying the metal layer and the sacrificial layer under the metal layer to form the source and drain regions.

13. The method of claim 1, wherein the sacrificial layer is selected from a group consisting of $Si_{1-x}Ge_x$, GaAs, InGaAs, InP, $In_{1-x}Ga_xAs_yP_{1-y}$.

14. The method of claim 1, wherein the metal layer is selected from a group consisting of Co, Ni, Pd, Pt, Rh, Ta, Ti, W.

15. The method of claim 1, wherein the patterned masking layer is laterally removed by an isotropic etching process.

16. The method of claim 1, wherein the remained insulating layer is laterally removed by an anisotropic etching process.

17. The method of claim 1, wherein the length of the gate electrode is less than 0.2 $\mu$m.

18. A method for fabricating a T-shape gate window, comprising:

providing a substrate having a sacrificial layer, a metal layer and an insulating layer in turn formed thereon;

forming a patterned masking layer over the insulating layer for defining a first gate window;

removing a portion of the insulating layer and the metal layer using the patterned masking layer as a mask to formed the first gate window, and a portion of the sacrificial layer is exposed to the first gate window;

laterally removing a portion of the patterned photoresist layer; and laterally removing a portion of the remained insulating layer using the remained photoresist as a mask to form a second gate window, wherein the width of second gate window is greater than the width of the first gate window, and the first and the second gate windows form a T-shape gate window.

19. The method of claim 18, wherein the masking layer is a positive photoresist layer.

20. The method of claim 19, wherein the step for laterally removing a portion of the patterned masking layer is performed using an oxygen-containing plasma.

21. The method of claim 18, wherein the sacrificial layer is selected from a group consisting of $Si_{1-x}Ge_x$, GaAs, InGaAs, InP, $In_{1-x}Ga_xAs_yP_{1-y}$.

22. The method of claim 18, wherein the metal layer is selected from a group consisting of Co, Ni, Pd, Pt, Rh, Ta, Ti, W.

23. The method of claim 18, wherein the patterned masking layer is laterally removed by an isotropic etching process.

24. The method of claim 18, wherein the remained insulating layer is laterally removed by an anisotropic etching process.

25. The method of claim 18, wherein the length of the T-shape gate window is less than 0.2 $\mu$m.

* * * * *